United States Patent [19]
Sato et al.

[11] Patent Number: 5,305,331
[45] Date of Patent: Apr. 19, 1994

[54] DATA LOGGING APPARATUS WITH MEMORY AND PATTERN TESTING DEVICE

[75] Inventors: Toshiya Sato; Akira Shimizu; Hajime Hiroi; Hirohisa Ooishi, all of Tokyo, Japan

[73] Assignee: Ando Electric Co., Ltd., Tokyo, Japan

[21] Appl. No.: 684,411

[22] Filed: Apr. 12, 1991

[30] Foreign Application Priority Data

Apr. 23, 1990 [JP] Japan .................................. 2-107053

[51] Int. Cl.$^5$ ...................... G06F 11/00; G01R 31/28
[52] U.S. Cl. .................................. 371/29.1; 371/20.4; 371/24; 371/27
[58] Field of Search ...................... 371/29.1, 25.1, 27, 371/16.5, 20.4, 21.2, 21.6, 24, 71

[56] References Cited

U.S. PATENT DOCUMENTS 4,788,684  11/1988  Kawaguchi et al. .................. 371/21
5,053,698  10/1991  Ueda .................................. 324/158

FOREIGN PATENT DOCUMENTS

2-208517  8/1990  Japan .

*Primary Examiner*—Robert W. Beausoliel, Jr.
*Assistant Examiner*—Norman M. Wright
*Attorney, Agent, or Firm*—Panitch Schwarze Jacobs & Nadel

[57] ABSTRACT

A data logging apparatus for a device function tester comprises a first shift circuit (1) supplied with an output signal of the tester and a strobe signal for shifting the output of the tester by n rates under the timing of a basic clock ($T_0$), a second shift circuit (2) for shifting the timing of the basic clock ($T_0$) by n rates, a write pulse generating circuit (3) supplied with the output signal of the shift circuit (2), a third shift circuit (4) supplied with a memory address signal for shifting it by n rates under the timing of the basic clock ($T_0$), a fourth shift circuit (5) for shifting a pattern address signal by n rates under the timing of the basic clock ($T_0$), a first memory (6) supplied with the output signal of the first shift circuit (1) and the output signal of the third shift circuit (1) for storing the result of the test shifted by n rates in response to a write command signal, and a second memory (7) supplied with the output of the fourth shift circuit (5) and the output of the third shift circuit (4) for storing the pattern address shifted by n rates in response to the write command signal. Data logging can be accomplished without being affected by variable time intervals of write enable strobe pulses.

2 Claims, 7 Drawing Sheets

DATA LOGGING APPARATUS WITH MEMORY AND PATTERN TESTING DEVICE

BACKGROUND OF THE INVENTION

1. Field of the Invention

The present invention generally relates to a data logging apparatus. More particularly, the invention is concerned with a data logging apparatus destined for use in an IC (Integrated Circuit) function test system for diagnosing IC devices as to whether or not they function satisfactorily or successfully, wherein the data resulting from the test are recorded in a memory for the purpose of subsequent analysis of fail data.

2. Description of the Prior Art

Figure 4:
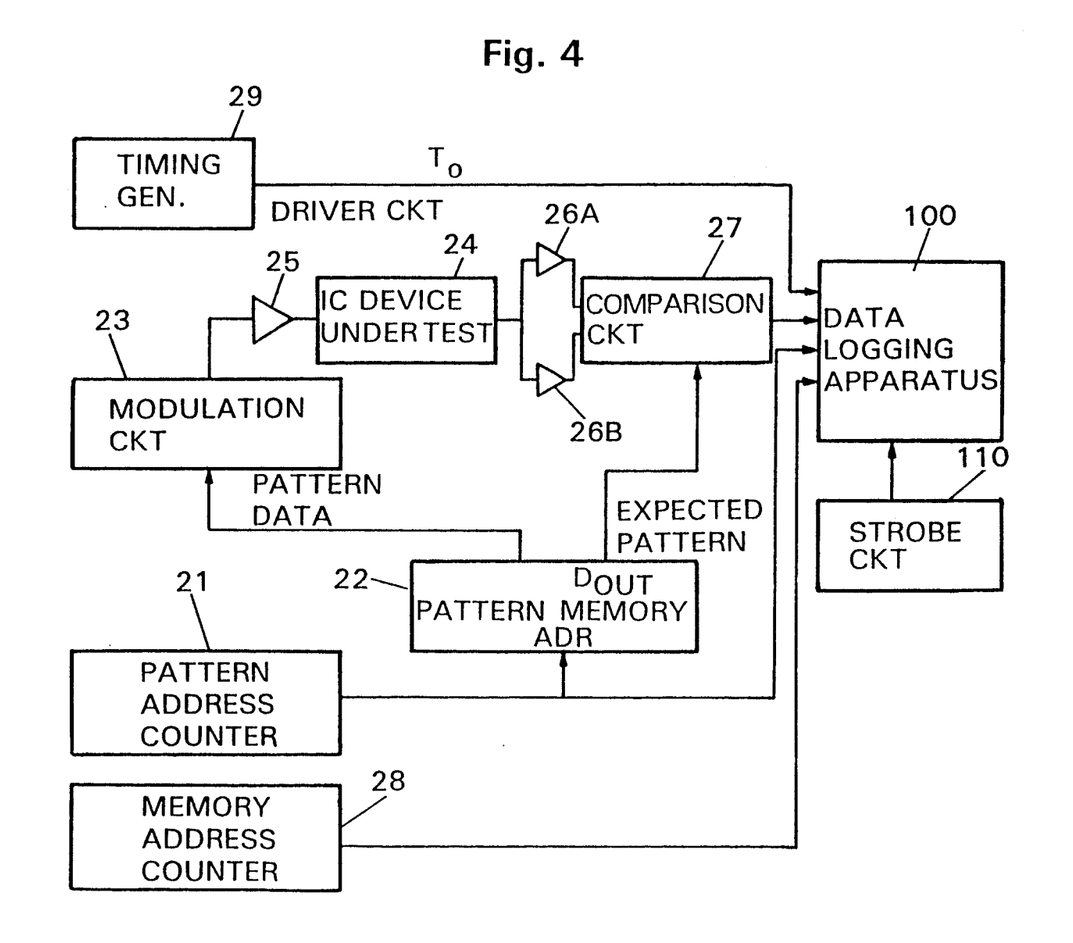
FIG. 4 is a block diagram showing a structure of a function test circuit.

A circuit structure of an IC function test system known heretofore in the art is shown in FIG. 4 of the accompanying drawings and will be described below to make clear the subject matter contemplated by the present invention.

In this figure, reference numeral 21 denotes a pattern address counter, 22 denotes a pattern memory, 23 denotes a modulation circuit, 24 denotes a device under test, 25 denotes a driver circuit, 26A denotes a high-selector, 26B denotes a low-selector, 27 denotes a comparison circuit, 28 denotes a memory address counter and 29 denotes a timing generator.

When the device 24 is to be tested as to the function thereof, a designated patter address is placed in the pattern address counter 21. Unless any address pattern is specified, the counter 21 is set to zero. The output of the pattern address counter 21 is inputted to an addressing terminal of the pattern memory 22 which then responds thereto by outputting pattern data.

The pattern data outputted from the pattern memory 22 is processed by the modulation circuit 23, as a result of which a pattern required for testing the function of the device 24 of concern is obtained. The pattern is then applied to the device 24 under test as a corresponding electric signal through the driver circuit 25. A signal outputted from the device 24 under test in response to the application of the pattern data signal is supplied to the inputs of the high-selector 26A and the low-selector 26B, respectively. In case an expected pattern supplied from the pattern memory 22 is of high level, the result of the comparison between the expected pattern and the pattern data signal selected by the high-selector 26A is produced as an output signal of the comparison circuit 27. On the other hand, when the expected pattern is of a low level, the former is compared with the pattern data signal inputted to the low-selector 26B, the result of which is produced as the output signal of the comparison circuit 27. In any case, the output signal of the comparison circuit 27 is supplied to a data logging apparatus 100.

The pattern address counter 21 then places therein a next address under the timing of a basic clock signal $T_0$ which is produced by the timing generator 29. On the other hand, the memory address counter 28 starts the address counting operation only when the pattern address has reached a data logging start address which has previously been set up as the condition for the data logging before starting the function test. It should however be mentioned that the memory address counter 28 is incremented approximately under the timing of the basic clock $T_0$.

The data logging apparatus 100 mentioned above is destined to serve as a circuit for writing in a data logging memory (not shown) the pattern addresses, the associated memory addresses and the fail data. The data logging memory also serves for storing time-serially input/output information to be furnished to a device 24 under test upon performing the function test.

Figure 5:
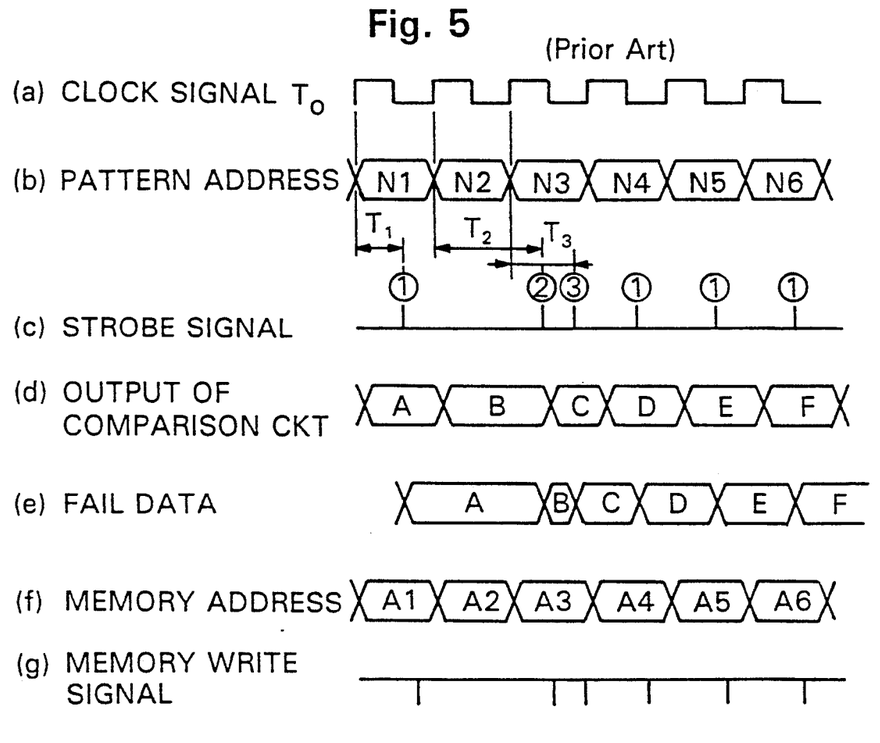
FIG. 5 is a timing chart for illustrating operation of a prior art data logging apparatus.

Now, operation of the data logging apparatus 100 of the prior art will be elucidated by reference to a timing chart shown in FIG. 5.

In this figure, there are illustrated the basic clock signal $T_0$ at (a), data of the pattern address at (b), a strobe signal at (c), the output data of the comparison circuit 27 at (d), the fail data at (e), the memory address at (f) and a memory write signal at (g), respectively.

Under the timing of the clock signal $T_0$ generated by the timing generator 29 and shown at (a) in FIG. 5, application of the signal to the device 24 under test is controlled. At this juncture, a period of the basic timing signal $T_0$ is referred to as a rate.

The pattern address data shown at (b) in FIG. 5 is generated under the timing of the basic clock $T_0$ as well.

The strobe signal shown in FIG. 5 at (c) serves as a timing control signal for controlling the timing of fetching the output of the comparison circuit 27 as a signal representing the result of the test. This strobe signal (c) is outputted by a strobe circuit 110 shown in FIG. 4 at time intervals previously set with reference to the basic clock $T_0$. More specifically, the strobe signal shown at (c) in FIG. 5 may be so set as to fall within a first rate (period) from the rising-up of the basic clock $T_0$, as indicated by $T_1$ or fall within a succeeding rate (period), as indicated by $T_2$ or fall within a n-th rate in more general terms. The numerals shown above the strobe pulses, respectively, indicate the strobe signal identification numbers, respectively, wherein those strobe pulses affixed with the same numeral are produced at the same time interval.

The output data (d) of the comparison circuit 27 represent the results of the comparisons between the output data actually outputted from the device 24 under test and the expected data to be outputted.

Shown at (e) in FIG. 5 are fail data latched from the output (d) of the comparison circuit 27 in response to the strobe signal (c) of FIG. 5.

Shown at (f) in FIG. 5 is the memory address signal which is in synchronism with the basic clock $T_0$.

Shown at (g) in FIG. 5 is the memory write pulse signal derived by delaying the strobe signal (c) for a predetermined amount.

Figure 6:
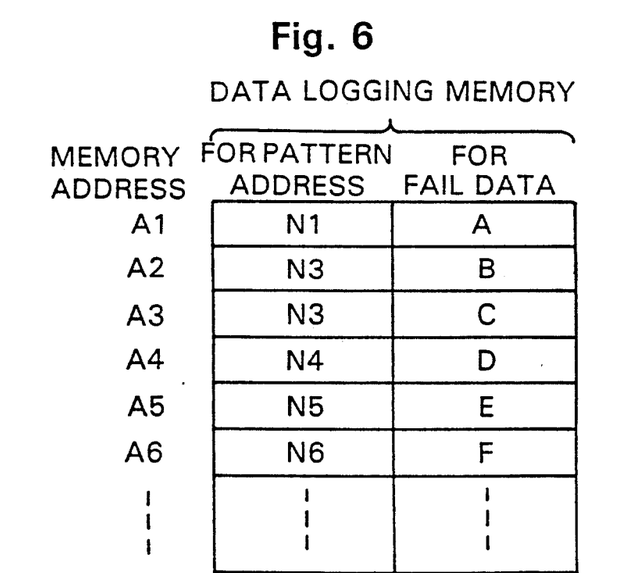
FIG. 6 is a memory status diagram showing a state of a data logging memory in which pattern address data and fail data have been written in accordance with the prior art data logging.

Assuming now that the pattern addresses N1, N2, N3 and so forth, the fail data A, B, C and so forth and the addresses A1, A2, A3 and so forth are written in the data logging memory, the state of the data written in this memory may be such as shown in FIG. 6. Referring to this figure, although the pattern address data N2 should have been written at the memory address A2, the pattern address data N3 has actually been written at this memory address, which can be explained by the fact that the strobe signal (c) for the pattern address (b) becomes different for the pattern data N2, as can be seen in FIG. 5. More specifically, the strobe signal for the pattern address N2 shown at (b) in FIG. 5 is set to extend into the rate (period) of the pattern address N3 beyond the rate of the pattern address N2. As a consequence, at the time point when the fail data B shown at (e) in FIG. 5 makes appearance, the pattern address N2 shown at (b) in FIG. 5 has already been replaced by the pattern address N3, whereby the pattern address N3 is erroneously written in the data logging memory at the address A2, as illustrated in FIG. 6.

Under the circumstances, as an attempt to evade the trouble mentioned above, the pattern addresses generated in response to the strobe pulses at different time intervals have heretofore been once latched at timings each corresponding to a half of the time interval of the relevant strobe pulse, whereon the other half of the strobe pulse duration is utilized for realizing the writing of the pattern address and the fail data.

Figure 7:
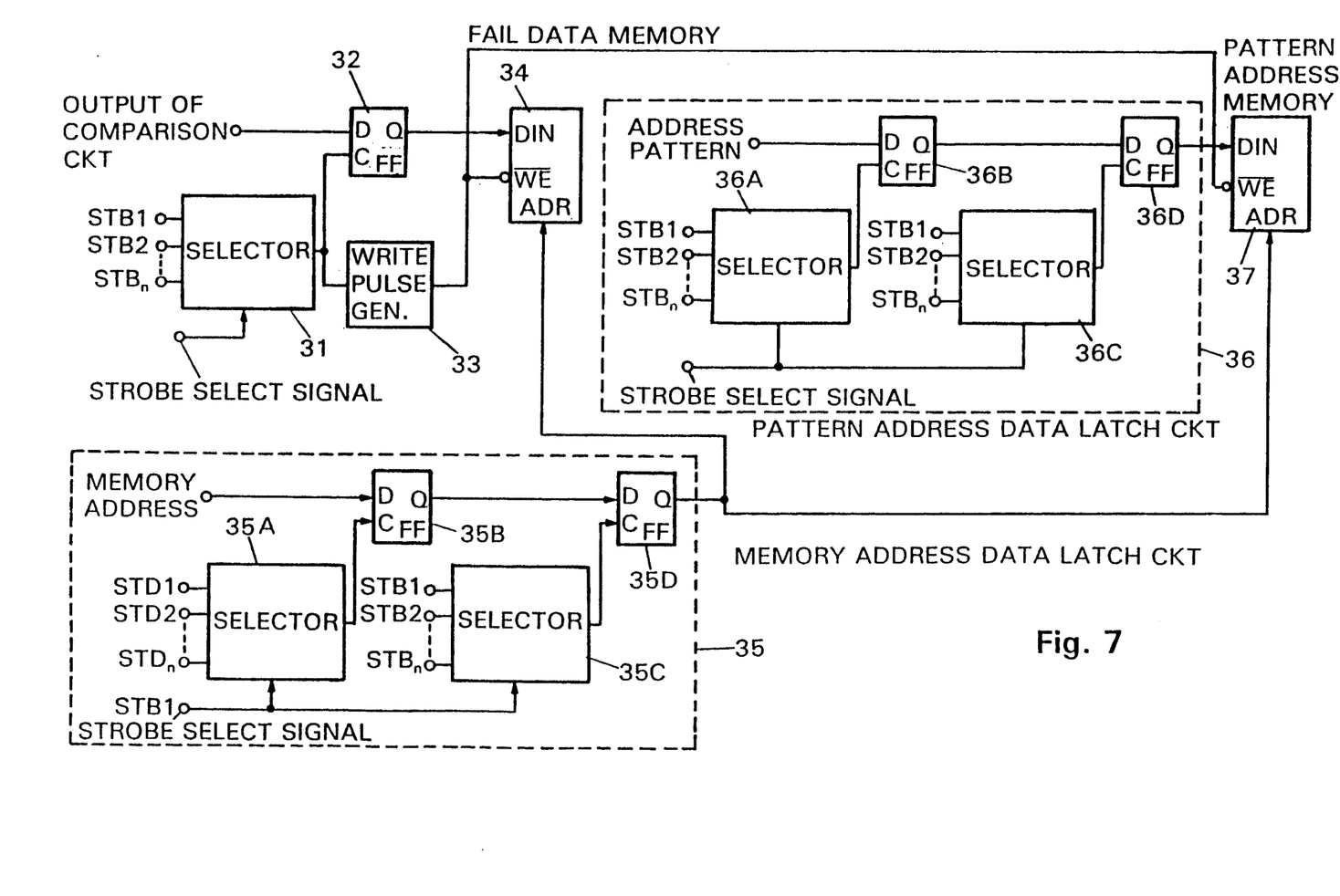
FIG. 7 is a circuit diagram showing a configuration of a data logging apparatus known heretofore.

FIG. 7 of the accompanying drawings shows a structure of the data logging apparatus which is so arranged as to latch the data at time intervals corresponding to halves of the strobe pulses, respectively.

In FIG. 7, reference numeral 31 denotes a selector, 32 denotes a flip-flop (FF for short), 33 denotes a write pulse generating circuit, 34 denotes a fail data storing memory, 35 denotes a memory address data latch circuit, 36 denotes a pattern address data latch circuit and 37 denotes a pattern address storing memory.

The memory address data latch circuit 35 is constituted by a selector 35A, another selector 35C, a flip-flop 35B and another flip-flop 35D. Similarly, the pattern address data latch circuit 36 is composed of selectors 36A and 36C and flip-flops (FF) 36B and 36D.

Operation of the data logging apparatus shown in FIG. 7 will be described by reference to a timing chart of FIG. 8.

Figure 8:
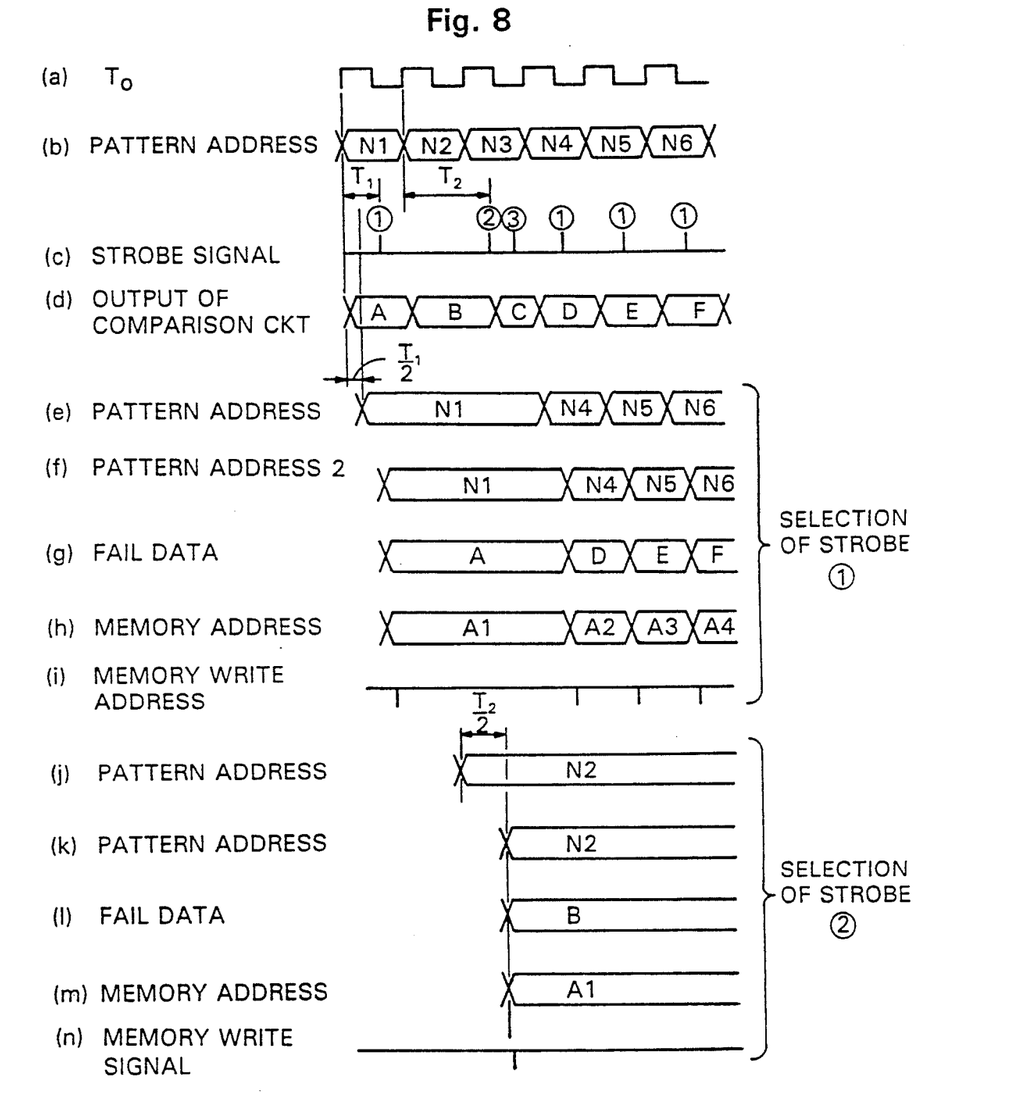
FIG. 8 is a timing chart for illustrating the operation of the data logging apparatus shown in FIG. 7 on the assumption that data is latched at a timing of a half of preset time intervals of strobe signal pulses.

Shown at (e) in FIG. 8 is the pattern address data latched by the flip-flop (FF) 36B at a timing corresponding to a half of the time interval $T_1$ of the strobe pulse STD1 selected in response to the strobe select signal by the selector 36A constituting a part of the pattern address data latch circuit 36 shown in FIG. 7, while the pattern address data 2 shown at (f) in FIG. 8 is latched by the flip-flop (FF) 36D in response to the strobe signal STB1 selected by the strobe signal selector 36C of the pattern address latch circuit 36 shown in FIG. 7.

The fail data shown at (g) in FIG. 8 is obtained by latching the output (FIG. 8, d) of the comparison circuit (27 in FIG. 4) in response to the strobe signal STB1 selected by the selector 31 shown in FIG. 7. The memory addresses are also outputted under the timing of the strobe signal STB1 as in the case of the pattern addresses.

In this manner, in the case of the pattern address data 2 shown at (f) in FIG. 8 which is outputted under the timing of the strobe signal ①  shown at (c) in FIG. 8, the pattern address data and the fail data shown at (g) in FIG. 8 are written in the pattern address memory 37 and the fail data memory 34, respectively, in response to the memory write signal derived from the strobe signal, as shown at (i) in FIG. 8, by the write pulse generating circuit 33 shown in FIG. 7.

At that time, the pattern addresses at which the fail data are written correspond to N1, N4, N5 and N6, respectively, because the strobe signal selected by the selectors 31, 35C and 36C is the strobe signal ① shown at (c) in FIG. 8, and no fail data are written at the pattern addresses N2 and N3.

Consequently, in order to obtain the fail data for the pattern address N2, the strobe signal ② has to be so selected as to write the fail data at the timing corresponding to a half of the time interval $T_2$ of the strobe signal ② to thereby execute again the test with the aid of the strobe signal ②.

The timing relations among the pattern address, the fail data, the memory address and the memory write signal at the time when the strobe signal ② is selected are shown at (k), (l), (m) and (n), respectively, in FIG. 8.

It is thus apparent that, in general, in order to allow the time interval of the strobe signal to extend so as to fall within the n-th rate (period), it is necessary at the first latch timing to write the fail data at the time interval corresponding to 1/n.

As will be understood from the foregoing, the prior art data logging apparatus indispensably requires the selection of the appropriate strobe signal without fail upon every execution of the data logging, which means that when the data logging is to be performed for all the patterns, selection of the strobe signals of the different time intervals and execution of the test must be repeated, which of course requires a much complicated and expensive circuit configuration, not to say of a problem that a long time is taken for performing the function test of IC devices.

SUMMARY OF THE INVENTION

It is therefore an object of the present invention to provide a data logging apparatus which can evade the disadvantages and problems the prior art data logging apparatus suffers and which can execute data logging for all the patterns though a single test without need for selection of the strobe signals.

It is another object of the invention to provide a device function testing system equipped with the data logging apparatus mentioned above.

In view of the above and other objects which will become more apparent as description proceeds, there is provided according to an aspect of the present invention a data logging apparatus which comprises a first shift circuit having inputs supplied with an output signal of a tester and a strobe signal, respectively, for shifting the output of the tester by a predetermined number of rates under the timing of a basic clock, a second shift circuit for shifting the timing of the basic clock by the predetermined number of rates, a write pulse generating circuit having an input supplied with the output signal of the shift circuit, a third shift circuit having an input supplied with a memory address signal for shifting it by the predetermined number of rates under the timing of the basic clock, a fourth shift circuit for shifting a pattern address signal by the predetermined number of rates under the timing of the basic clock, a first memory having a data input supplied with the output signal of the first shift circuit and an address input supplied with the output signal of the third shift circuit for storing data of result of the test shifted by the predetermined number of rates in response to the output of the write pulse generating circuit, and a second memory having a data input supplied with the output of the fourth shift circuit and an address input supplied with the output of the third shift circuit for storing the pattern address shifted by the predetermined number of rates in response to the output of the write pulse generating circuit.

With the arrangement of the data logging apparatus described above, it is possible to store all the pattern addresses and the fail data in a data logging memory at one time without need for selecting the strobe pulses which may be set at time intervals covering different numbers of rates. The data logging apparatus can thus be implemented inexpensively in a much simplified structure because of no necessity of selecting the strobe pulses while reducing the time taken for the test.

According to another aspect of the invention, there is provided a device function test system incorporating the data logging apparatus mentioned above.

BRIEF DESCRIPTION OF THE DRAWINGS

The above and other objects, features and advantages of the present invention will be better understood from the following description of preferred embodiments thereof taken in conjunction with the accompanying drawings, in which.

DETAILED DESCRIPTION OF THE PREFERRED EMBODIMENTS

Now, the present invention will be described in detail in conjunction with an exemplary or preferred embodiment thereof by reference to the drawings.

Figure 1:
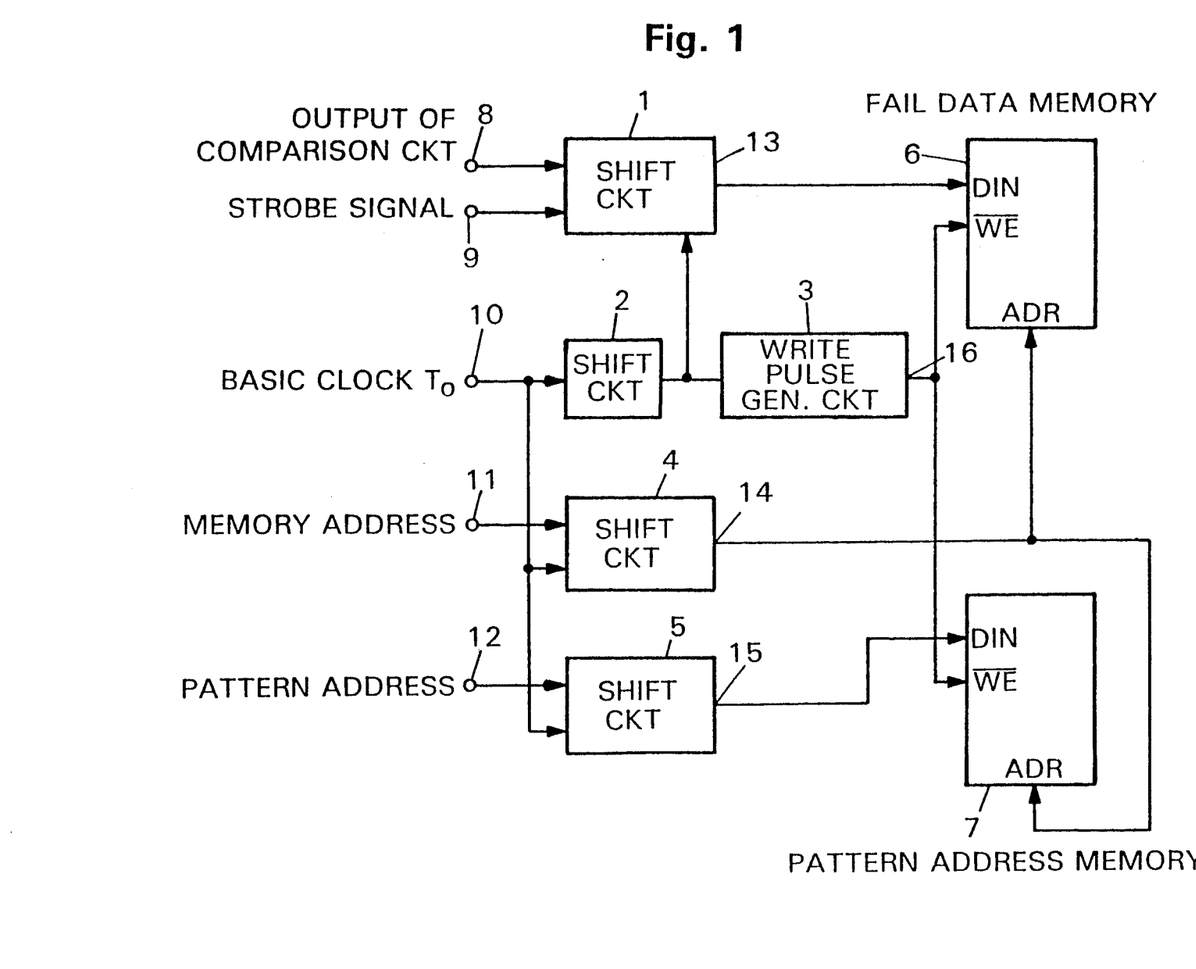
FIG. 1 is a schematic block diagram showing a general arrangement of the data logging apparatus according to an embodiment of the invention.

Referring to FIG. 1 which shows generally a circuit arrangement of the data logging apparatus according to an embodiment of the invention, reference numerals 1 and 2 denote shift circuits, respectively, 3 denotes a write pulse generating circuit, 4 and 5 denote shift circuits, respectively, and numerals 6 and 7 denote a fail data memory and a pattern address memory, respectively.

The shift circuit 1 has inputs supplied, respectively, with a strobe signal and the output of the comparison circuit 27 of the function test apparatus described hereinbefore by reference to FIG. 4 and serves for shifting the output of the comparison circuit 27 by n rates (periods) under the timing of a basic clock $T_0$, while the shift circuit 2 serves to shift the timing of the basic clock $T_0$ itself by n rates or (n−1) rates.

The output of the shift circuit 2 is inputted to the write pulse generating circuit 3 which responds thereto by producing a write pulse at an output terminal 16 thereof.

On the other hand, the shift circuit 4 shifts the memory address inputted at 11 by n rates under the timing of the basic clock $T_0$, while the shift circuit 5 shifts the pattern address inputted at 12 by n rates under the timing of the basic clock $T_0$.

The output 13 of the n-rate shift circuit 1 is applied to the data input terminal DIN of the memory 6 which has the address input terminal ADR supplied with the output 14 of the shift circuit 4, whereby the memory 6 stores the decision result data (i.e. the output data of the comparison circuit 27 shown in FIG. 4) shifted by n rates by the shift circuit 1 in response to the write pulse 16 outputted from the write pulse generating circuit 3 and applied to the input $\overline{WE}$.

The pattern address memory 7 has the data input terminal DIN supplied with the output 15 of the shift circuit 5 and the address input terminal ADR supplied with the output 14 of the shift circuit 4 for storing the pattern address 15 shifted by n rates by the shift circuit 5 in response to the output of the write pulse generating circuit 3.

Next, an exemplary circuit configuration of the data logging apparatus shown in FIG. 1 will be described by reference to FIG. 2, which makes it possible to set the time interval of the strobe pulse such that duration thereof can extend or spread into the succeeding rate (period).

Figure 2:
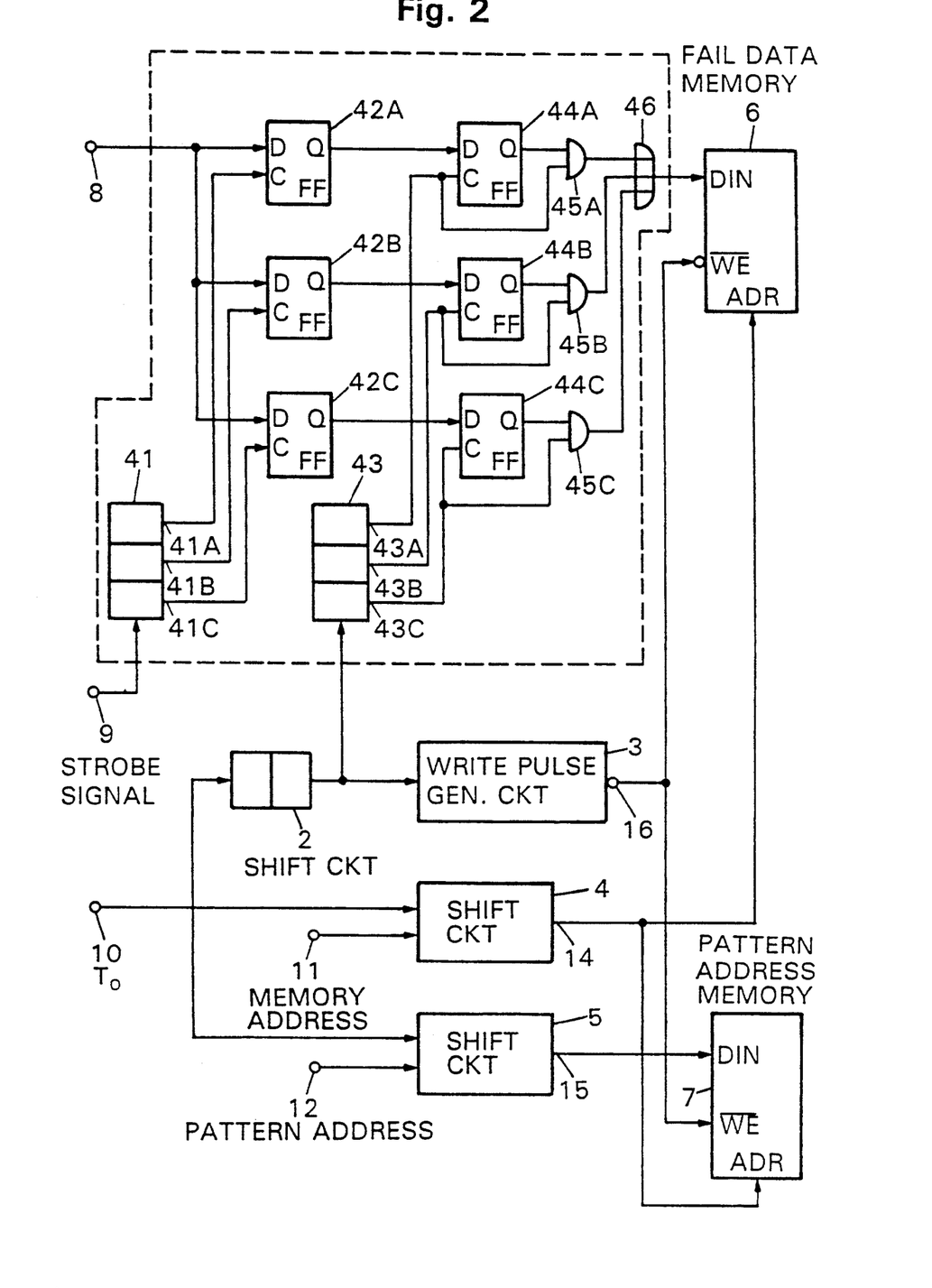
FIG. 2 is a block diagram showing in detail a circuit configuration of the data logging apparatus according to an embodiment of the invention.

Referring to FIG. 2, reference numerals 41 and 43 denote conversion circuits each designed for responding to one input to thereby produce three outputs sequentially or serially. More specifically, when a strobe pulse signal 9 is inputted to the circuit 41, the first pulse of the strobe pulse signal is outputted to an output terminal 41A, while the second strobe pulse makes appearance at an output terminal 41B with a third input strobe pulse making appearance at an output terminal 41C, whereby triplet outputs 41A, 41B and 41C are produced sequentially by the circuit 41 in a repetitive manner every time the strobe pulse signal is inputted. The circuit 43 also operates in the same manner as the circuit 41.

Describing now operation of the 2-rate shift circuit 1 (i.e. n=2) by reference to FIG. 2, the output of the comparison circuit 27 (FIG. 4) applied to an input terminal 8 is once latched by flip-flops 42A to 42C, respectively, in response to the strobe pulse signal 9. At this junction, it should be noted that the outputs of the latched data signals do not necessarily coincide with the timing of the pattern address because some strobe pulses have the preset time intervals which may cover a number of rates (periods).

Under the circumstances, the basic clock signal $T_0$ applied at 10 is shifted by two rates through a 2-rate shift circuit 2 (i.e. n=2) before being inputted to the shift circuit 43 and then latched by the flip-flops 44A, 44B and 44C sequentially so that the decision result data 8 can be outputted to the fail data memory 6 under the timing of the basic clock $T_0$.

Each of the shift circuits 4 and 5 is implemented in the same structure as the 2-rate shift circuit 2 mentioned above.

By virtue of the arrangement that the shift circuits 4 and 5 function to shift backwardly by two rates the pattern address and the memory address, respectively, under the timing of the basic clock signal $T_0$ before the pattern address and the memory address are outputted, all the signals including the pattern address, the decision result data (output of the comparison circuit 27 of FIG. 4) and the memory address can be outputted under the timing of the basic clock signal $T_0$ shifted by two cycles independent of the preset time intervals of the strobe signal pulses, whereby the results of decision for all the pattern addresses can be stored in the memory 6 through a single test without need for selection of the strobe signal pulses as to the preset time intervals thereof.

Figure 3:
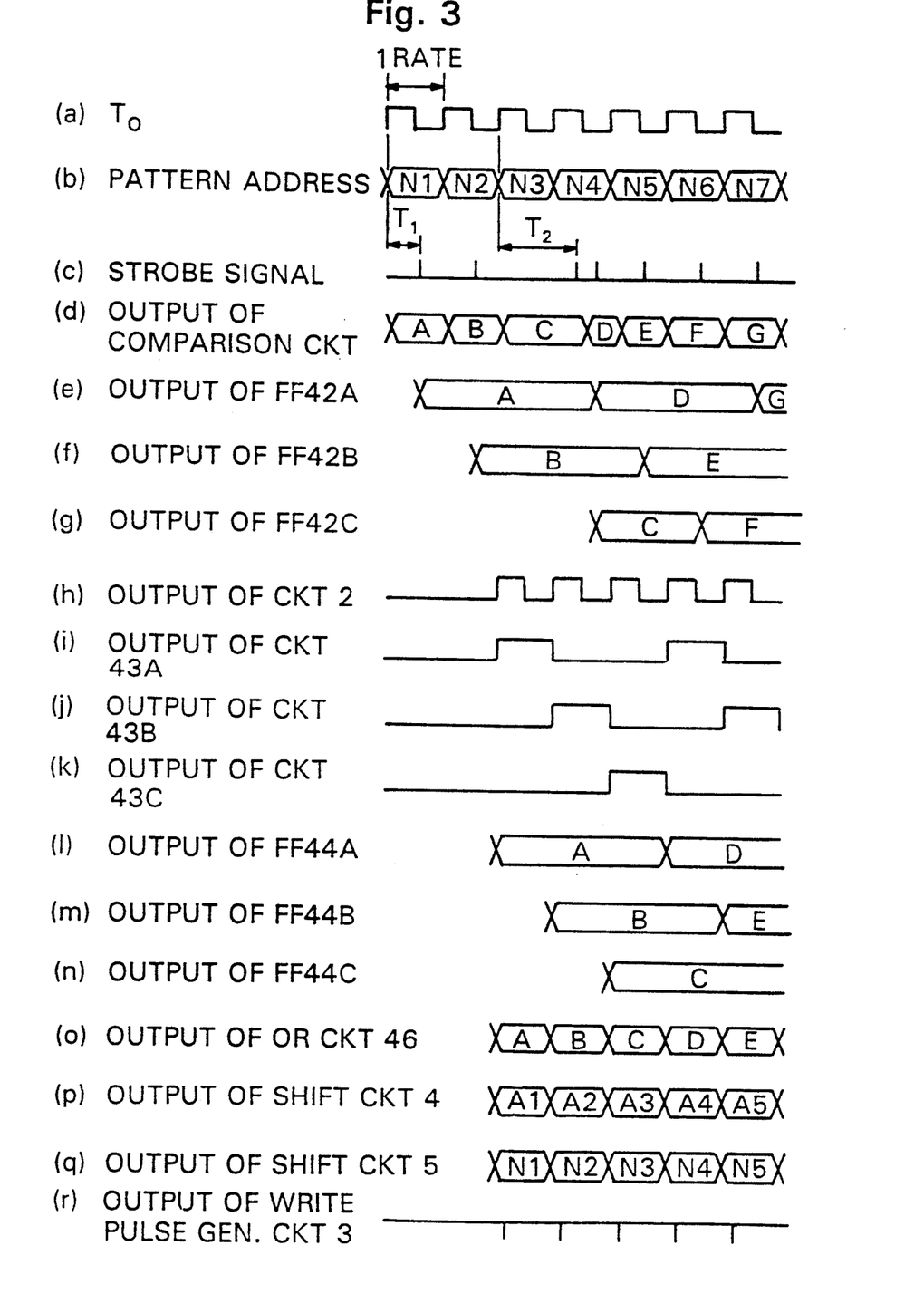
FIG. 3 is a timing chart for illustrating operation of the data logging apparatus shown in FIG. 2.

Now, operation of the circuit shown in FIG. 2 will be elucidated in more concrete by reference to the timing chart of FIG. 3.

Pattern addresses N1, N2, N3 and so forth shown at (b) in FIG. 3 correspond, respectively, to the outputs A, B, C and so forth of the comparison circuit 27 (FIG. 4).

Shown at (e) to (g) in FIG. 3 are outputs of the flip-flops 42A, 42B and 42C, respectively. The decision result data available from the output of the comparator circuit 27 (FIG. 4) and inputted to the terminal 8 are sequentially latched by the flip-flops 42A, 42B and 42C under the timing of the outputs 41A, 41B and 41C of the circuit 41 (FIG. 2) to which the strobe pulse signal shown at (c) in FIG. 3 is inputted.

Shown at (h) in FIG. 3 is a waveform of the basic clock signal $T_0$ shifted by two rates through the 2-rate shift circuit 2.

Waveforms shown at (i) to (k) in FIG. 3 represent the outputs produced sequentially from the stages 43A, 43B and 43C, respectively, of the circuit 43 in response to the application of the basic clock $T_0$ shifted through the 2-rate shift circuit 2 of FIG. 2.

Shown at (l) to (n) in FIG. 3 are the output data of the comparison circuit 27 (FIG. 4) latched by the flip-flops 44A to 44C sequentially under the timing of the outputs of the circuits 43A, 43B and 43C shown at (i) to (k) in FIG. 3, respectively.

Turning back to FIG. 2, reference symbols 45A, 45B and 45C denote AND circuits each having two inputs and 46 denotes an OR circuit to which all the outputs of the AND circuits 45A, 45B and 45C are inputted. These AND circuits and the OR circuit are provided for the purpose of synthesizing or combining together the divided data of the output of the comparison circuit 27 (FIG. 4) which are separated along three paths for holding the output of the comparison circuit for duration up to three rates. The single combined signal outputted from the OR circuit 46 is supplied to the data input terminal DIN of the fail data memory 6 as one of the signals applied thereto.

The synthesized data outputted from the OR circuit 46 is shown at (o) in FIG. 3.

The pulse generating circuit 3 produces the write pulse at the time point when all the data to be inputted to the data input terminal and the address input terminal of the memory 6 have been prepared.

By shifting the pattern address by two rates in the similar manner by the same circuits as those shown in FIG. 2, the pattern address can be written in the memory 7 at the same timing as that for the decision result data.

In this way, the addresses of all the patterns and the decision result data can be written in the memory 6 at a constant timing independent of the setting of the time intervals of the strobe pulses.

As will now be appreciated from the foregoing description, it is possible according to the teachings of the invention incarnated in the illustrated embodiment to store all the pattern addresses and the fail data in the data logging memory unit at one time without need for selecting the strobe pulses which may be set at time intervals covering n rates. Thus, the data logging apparatus according to the invention can be implemented inexpensively in a much simplified structure because of no necessity of selecting the strobe pulses while reducing the time taken for the test, to great advantages.

While the invention has been described in terms of its preferred embodiments, it should be understood that numerous modifications and changes may be made thereto without departing from the spirit and scope of the invention as defined in the appended claims. It is therefore intended that all such modifications fall within the scope of the claims.

We claim:

1. A data logging apparatus, comprising:
   a first shift circuit having inputs supplied with data to be logged and a strobe signal, the first shift circuit shifting said data to be logged by n rates, the shifted data being an output signal of the first shift circuit;
   a second shift circuit having an input supplied with a basic clock signal, the second shift circuit shifting said basic clock signal by n rates or alternatively (n−1) rates, the shifted clock signal being an output signal of the second shift circuit and an input to the first shift circuit, the first shift circuit shifting said data under the shifted clock signal;
   a write pulse generating circuit having an input supplied with said shifted clock signal of said second shift circuit, the write pulse generating circuit generating as an output signal a write pulse signal;
   a third shift circuit having inputs supplied with a memory address signal and the basic clock signal, the third shift circuit shifting the memory address signal by n rates under said basic clock signal, the shifted memory address signal being an output signal of the third shift circuit;
   a fourth shift circuit having inputs supplied with a pattern address signal and the basic clock signal, the fourth shift circuit shifting the pattern address signal by n rates under said basic clock signal, the shifted pattern address signal being an output signal of the fourth shift circuit;
   a first memory having a data input supplied with said shifted data from said first shift circuit, a write signal input supplied with said write pulse signal from said write pulse generating circuit, and an address input supplied with said shifted memory address signal from said third shift circuit, the first memory storing the shifted data at the shifted memory address in response to the write pulse signal; and
   a second memory having a data input supplied with said shifted pattern address signal from said fourth shift circuit, a write signal input supplied with said write pulse signal from said write pulse generating circuit, and an address input supplied with said shifted memory address signal from said third shift circuit, the second memory storing said shifted pattern address at the shifted memory address in response to said write pulse signal.

2. A system for testing a device, comprising:
   pattern generating means for generating pattern data to be applied to a device under test and for generating an expected pattern which is expected to be outputted from said device in response to said pattern data applied thereto;
   a decision circuit for deciding whether actual pattern data outputted from said device under test coincides with said expected pattern, the decision being an output signal of the decision circuit; and
   a data logging apparatus, wherein said data logging apparatus comprises:
   a first shift circuit having inputs supplied with the decision signal of said decision circuit and a strobe signal, the first shift circuit shifting said decision signal of said decision circuit by n rates, the shifted decision signal being an output signal of the first shift circuit, where n represents a given integer;

a second shift circuit having an input supplied with a basic clock signal, the second shift circuit shifting said timing of said basic clock signal by n rates, the shifted clock signal being an output signal of the second shift circuit and an input of the first shift circuit, the first shift circuit shifting the decision signal of said decision circuit under the shifted clock signal;

a write pulse generating circuit having an input supplied with said shifted clock signal of said second shift circuit, the write pulse generating circuit generating as an output signal a write pulse signal;

a third shift circuit having inputs supplied with a memory address signal and the basic clock signal, the third shift circuit shifting the memory address signal by n rates under said basic clock signal, the shifted memory address signal being an output signal of the third shift circuit;

a fourth shift circuit having inputs supplied with a pattern address signal and the basic clock signal, the fourth shift circuit shifting the pattern address signal by n rates under said basic clock signal, the shifted pattern address signal being an output signal of the fourth shift circuit;

a first memory having a data input supplied with said shifted decision signal from said first shift circuit, a write signal input supplied with said write pulse signal from said write pulse generating circuit, and an address input supplied with said shifted memory address signal from said third shift circuit, the first memory storing the shifted decision signal at the shifted memory address in response to the write pulse signal; and a second memory having a data input supplied with said shifted pattern address signal from said fourth shift circuit, a write signal input supplied with said write pulse signal from said write pulse generating circuit, and an address input supplied with said shifted memory address signal from said third shift circuit, the second memory storing said shifted pattern address at the shifted memory address in response to said write pulse signal.

* * * * *